United States Patent
Kawatoko et al.

(10) Patent No.: US 9,739,587 B2
(45) Date of Patent: Aug. 22, 2017

(54) SEMICONDUCTOR INTEGRATED CIRCUIT AND POSITION DETECTOR

(71) Applicant: Mitutoyo Corporation, Kawasaki-shi, Kanagawa (JP)

(72) Inventors: Osamu Kawatoko, Kawasaki (JP); Akio Kawai, Kawasaki (JP)

(73) Assignee: MITUTOYO CORPORATION, Kawasaki-Shi (JP)

( * ) Notice: Subject to any disclaimer, the term of this patent is extended or adjusted under 35 U.S.C. 154(b) by 176 days.

(21) Appl. No.: 14/743,269

(22) Filed: Jun. 18, 2015

(65) Prior Publication Data

US 2015/0369580 A1 Dec. 24, 2015

(30) Foreign Application Priority Data

Jun. 20, 2014 (JP) ................. 2014-126994

(51) Int. Cl.

| G01B 3/20 | (2006.01) |
|---|---|
| H02J 3/38 | (2006.01) |
| G01D 21/00 | (2006.01) |
| G11C 5/14 | (2006.01) |

(52) U.S. Cl.
CPC ............ *G01B 3/205* (2013.01); *G01D 21/00* (2013.01); *H02J 3/383* (2013.01); *G11C 5/147* (2013.01); *Y02E 10/563* (2013.01)

(58) Field of Classification Search
CPC ......... G01B 3/205; G01D 21/00; H02J 3/383; G11C 5/147

USPC ................................................. 33/706, 784
See application file for complete search history.

(56) References Cited

U.S. PATENT DOCUMENTS

| 5,440,501 A * | 8/1995 | Shimomura ......... G01D 5/2415 33/706 |
|---|---|---|
| 9,316,695 B2 * | 4/2016 | Takahashi .......... G01R 31/3613 |
| 2009/0115985 A1* | 5/2009 | Maeda ................... G03B 27/52 355/55 |
| 2014/0121787 A1* | 5/2014 | Yamazaki .......... H04L 12/2825 700/19 |
| 2014/0184314 A1* | 7/2014 | Takahashi .......... G01R 31/3613 327/524 |
| 2015/0369580 A1* | 12/2015 | Kawatoko ............. G01B 3/205 33/784 |

FOREIGN PATENT DOCUMENTS

JP  Y-2571356  2/1998

* cited by examiner

*Primary Examiner* — Yaritza Guadalupe-McCall
(74) *Attorney, Agent, or Firm* — Rankin, Hill & Clark LLP

(57) ABSTRACT

A semiconductor integrated circuit includes a regulator configured to stabilize a power supply voltage from a solar cell and to output the same, a voltage detection circuit configured to detect the power supply voltage from the solar cell or an output voltage from the regulator, a power-on-reset circuit configured to output a reset signal to an external digital circuit by a voltage detection signal output from the voltage detection circuit, a memory main body configured to write and read data by the power supply voltage from the solar cell or the output voltage from the regulator.

2 Claims, 2 Drawing Sheets

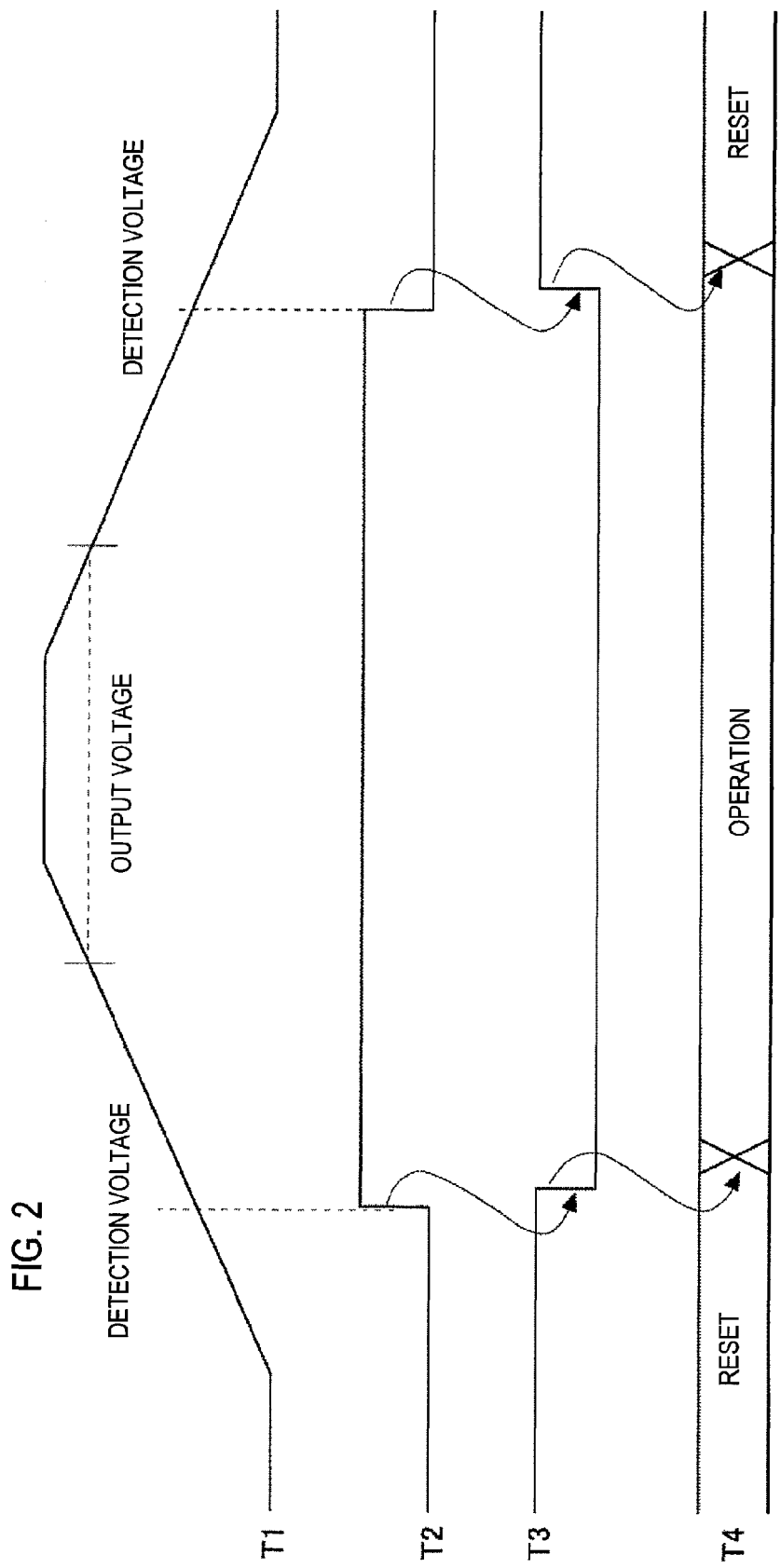

SEMICONDUCTOR INTEGRATED CIRCUIT AND POSITION DETECTOR

CROSS-REFERENCE TO RELATED APPLICATION

The present application claims priority from Japanese Patent Application No. 2014-126994 filed on Jun. 20, 2014, the entire content of which is incorporated herein by reference.

BACKGROUND

The present invention relates to a semiconductor integrated circuit and a position detector.

Regarding a position detector such as a digital vernier caliper, a digital micrometer, a digital indicator and the like, a position detector using a general battery cell as a power supply and a position detector using a solar cell as a power supply have been known.

As compared to an output voltage of the general battery cell, an output voltage of the solar cell is unstable. Therefore, when configuring a position detector using a solar cell as a power supply, it is necessary to mount an electrically rewritable non-volatile memory such as an electrically erasable programmable read-only memory (EEPROM) so as to preserve information such as an origin and a unit.

Also, the position detector using a solar cell as a power supply requires a power supply control circuit corresponding to the solar cell. The power supply control circuit is configured to stabilize the output voltage of the solar cell by using a voltage regulator, thereby outputting a reset signal when a power supply voltage is lowered.

Patent Document 1 discloses an absolute displacement measuring device using a solar cell. The absolute displacement measuring device disclosed in Patent Document 1 has a solar cell, and a power supply voltage control circuit configured to stabilize a power supply voltage supplied from the solar cell and to supply the same to each unit.

[Patent Document 1] Japanese Utility Model Registration No. 2,571,356

In order to reduce a manufacturing cost in a manufacturing process of the position detector, a position detection IC having a power supply control circuit, which corresponds to a solar cell and a general battery cell, has been developed. The developed position detection IC has the power supply control circuit. However, when the position detection IC is mounted on a position detector configured to operate by a general battery cell, a function of the power supply control circuit is stopped. That is, since the position detection IC of the position detector configured to operate by the general battery cell is added with the cost of the unnecessary power supply control circuit, the price thereof is increased.

In order to further reduce the manufacturing cost of the position detector configured to operate by the general battery cell, it is preferable to manufacture a position detector having a position detection IC not including a power supply control circuit.

However, according to the position detection IC mounted on the position detector, it is necessary to reset a digital circuit of the position detection IC upon activation of the position detector so as to prevent a malfunction. In the position detector using the general battery cell as a power supply, it is expected that a power supply voltage rises rapidly upon connection of the cell. Therefore, it is possible to reset the digital circuit of the position detection IC (Integrated Circuit) by mounting a simple power-on-reset circuit using a CR (Resistor Capacitor/Condenser) time constant. Meanwhile, in the position detector using the solar cell as a power supply, it is not possible to use the power-on-reset circuit using a CR time constant because the power supply rises gently.

Due to the above reasons, it is difficult to manufacture a position detector using both a general battery cell and a solar cell as a power supply and having a good quality at a low price while reducing the manufacturing cost.

SUMMARY

Exemplary embodiments of the present invention to provide a semiconductor integrated circuit and a position detector, which can be manufactured at a lower price.

A semiconductor integrated circuit according to an exemplary embodiment of the invention, comprises:

a regulator configured to stabilize a power supply voltage from a solar cell and to output the same;

a voltage detection circuit configured to detect the power supply voltage from the solar cell or an output voltage from the regulator;

a power-on-reset circuit configured to output a reset signal to an external digital circuit by a voltage detection signal output from the voltage detection circuit; and a memory main body configured to write and read data by the power supply voltage from the solar cell or the output voltage from the regulator.

A position detector according to an exemplary embodiment of the invention comprises:

a solar cell;

a memory to which a power supply voltage is supplied from the solar cell;

a position detection IC configured to be reset by a reset signal from the memory;

a sensor configured to be activated by the position detection IC and to output a position signal; and a display unit configured to display a detection result of the position detection IC, wherein the memory comprises:

a regulator configured to stabilize the power supply voltage from the solar cell and to output the same, a voltage detection circuit configured to detect the power supply voltage from the solar cell or an output voltage from the regulator, a power-on-reset circuit configured to output a reset signal to the position detection IC by a voltage detection signal output from the voltage detection circuit, and a memory main body configured to write and read data by the power supply voltage from the solar cell or the output voltage from the regulator.

According to the exemplary embodiments of the present invention, it is possible to provide the semiconductor integrated circuit and the position detector, which can be manufactured at a lower price.

BRIEF DESCRIPTION OF THE DRAWINGS

FIG. 2 is a timing chart showing operations of an EEPROM and a position detection IC according to an exemplary embodiment.

DETAILED DESCRIPTION

Figure 1:
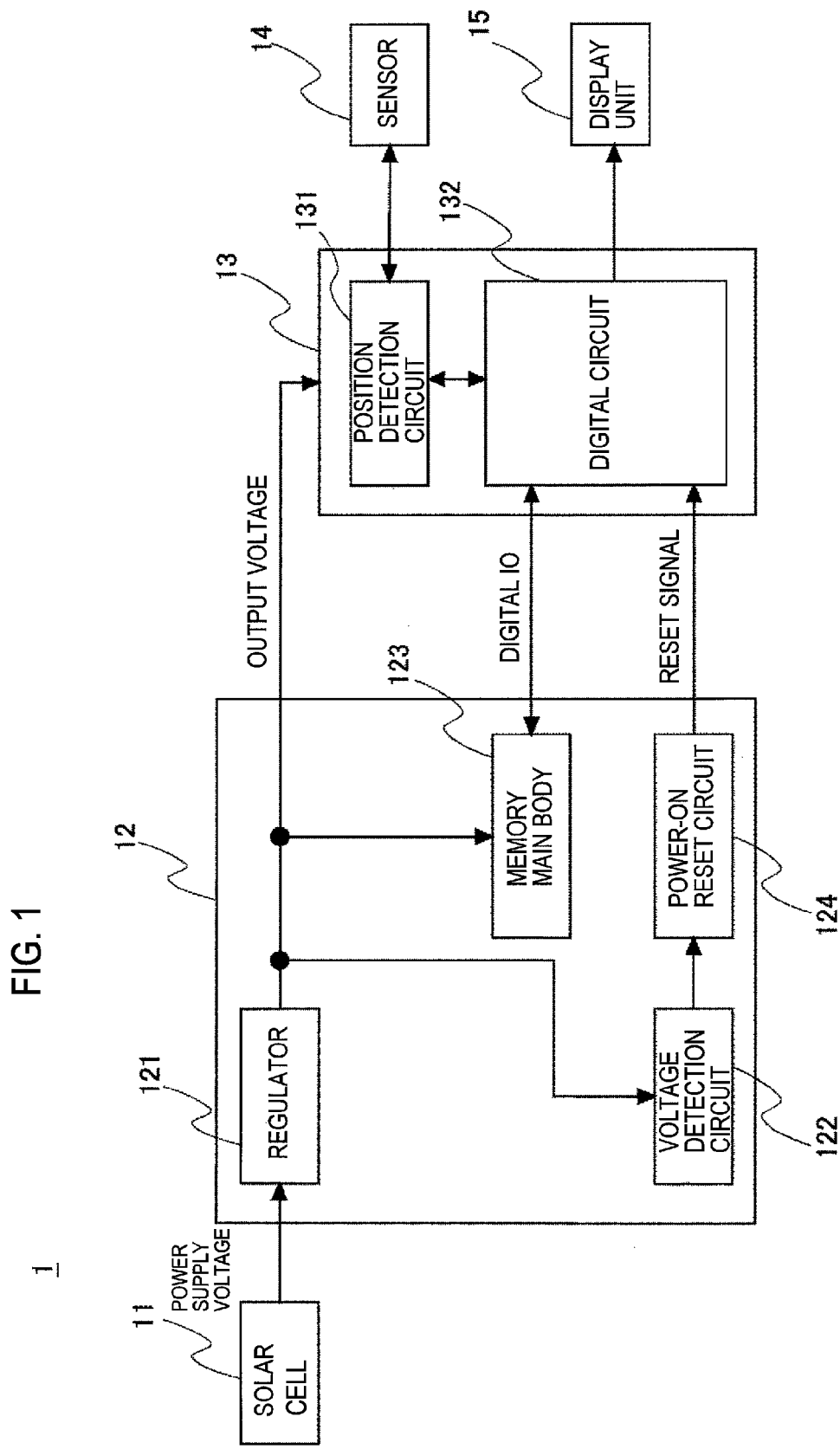
FIG. 1 is a block diagram of a position detector according to an exemplary embodiment.

Hereinafter, an exemplary embodiment of the present invention will be described with reference to the drawings.

FIG. 1 is a block diagram of a position detector according to an exemplary embodiment. The position detector 1 has a solar cell 11, an EEPROM 12 serving as a semiconductor integrated circuit, a position detection IC 13, a sensor 14, and a display unit 15.

The EEPROM 12 has a regulator 121, a voltage detection circuit 122, a memory main body 123, and a power-on-reset circuit 124. The position detection IC 13 has a position detection circuit 131, and a digital circuit 132.

The solar cell 11 is configured to generate power by solar light and to supply a power supply voltage to the regulator 121. The regulator 121 is configured to stabilize the power supply voltage supplied from the solar cell 11 and to output the same to the voltage detection circuit 122, the memory main body 123 and the position detection IC 13, as an output voltage.

The voltage detection circuit 122 is configured to detect the output voltage from the regulator 121. When the output voltage is equal to or higher than a detection voltage, the voltage detection circuit 122 outputs a voltage detection signal to the power-on-reset circuit 124. When the power-on-reset circuit 124 receives the voltage detection signal output from the voltage detection circuit 122, it outputs a reset signal to the digital circuit 132.

The memory main body 123 is configured to write and read data by the power supply voltage stabilized with the regulator 121.

The position detection circuit 131 and digital circuit 132 of the position detection IC 13 are operated by the power supply voltage stabilized with the regulator 121.

When the voltage detection signal is input from the voltage detection circuit 122 to the power-on-reset circuit 124, a reset signal is output from the power-on-reset circuit 124. When the reset signal is input to the digital circuit 132, the position detection IC 13 issues a sampling command to the position detection circuit 131. When the position detection circuit 131 receives the sampling command, it activates the sensor 14, and receives and encodes a position signal from the sensor 14, and to output the same to the digital circuit 132. The digital circuit 132 is configured to output a position information to the display unit 15.

Subsequently, the operations of the solar cell 11, the EEPROM 12 and the position detection IC 13 are described in more detail. FIG. 2 is a timing chart showing the operations of the EEPROM 12 and the position detection IC 13. In the meantime, a part of T1 shown with the dotted line indicates an output voltage of the regulator 121.

T1 indicates the power supply voltage from the solar cell 11, T2 indicates the voltage detection signal from the voltage detection circuit 122, T3 indicates the reset signal from the power-on-reset circuit 124, and T4 indicates a state of the position detection IC 13.

When the illuminance intensity is low, the power supply voltage T1 of the solar cell 11 is lowered. Therefore, the power supply voltage T1 does not exceed the detection voltage of the voltage detection circuit 122. Thus, the position detection IC 13 is at a reset state.

When the illuminance intensity is increased, the power supply voltage T1 is increased. When the illuminance intensity is sufficiently increased, the power supply voltage T1 exceeds the detection voltage of the voltage detection circuit 122. Then, the reset signal of the power-on-reset circuit 124 is released, and the position detection IC 13 is at an operating state.

When the illuminance intensity is lowered and the power supply voltage T1 is lowered, the power supply voltage T1 falls below the detection voltage of the voltage detection circuit 122. Then, since the reset signal is input from the power-on-reset circuit 124 to the position detection IC 13, the position detection IC 13 is at the reset state. Thereby, it is possible to suppress a malfunction of the position detection IC 13, which is caused due to the lowering of the power supply voltage.

According to the position detector of the exemplary embodiment, the power-on-reset circuit 124, which can cope with a slow voltage variation, is mounted on the EEPROM 12, and the reset signal is output from the power-on-reset circuit 124 of the EEPROM 12 to the position detection IC 13. Thereby, it is not necessary to mount a power supply control circuit on the position detection IC 13. Therefore, it is possible to configure the position detector 1 using a solar cell as a power supply by using the position detection IC 13 having no power supply control circuit. Also, since it is possible to reduce a chip area of the position detection IC 13 and to reduce the cost, it is possible to save the cost of the position detector using a general battery cell.

In the meantime, the present invention is not limited to the above exemplary embodiment and can be appropriately changed without departing from the gist thereof. For example, the EEPROM 12 is connected to the position detection IC 13. However, the connection target is not limited to the position detection IC 13. That is, the EEPROM 12 can be connected to a variety of digital circuits including a microcomputer, so that it can be applied to a wide range of applications.

Further, in the above exemplary embodiment, the EEPROM has been representatively exemplified as the electrically rewritable non-volatile memory. In addition to this, a resistance random access Memory (ReRAM), a ferroelectric random access memory (FeRAM), a magnetoresistive random access memory (MRAM) and the like can also be applied.

What is claimed is:

1. A semiconductor integrated circuit comprising:
   a regulator configured to stabilize a power supply voltage from a solar cell and to output the same;
   a voltage detection circuit configured to detect the power supply voltage from the solar cell or an output voltage from the regulator;
   a power-on-reset circuit configured to output a reset signal to an external digital circuit by a voltage detection signal output from the voltage detection circuit; and
   a memory main body configured to write and read data by the power supply voltage from the solar cell or the output voltage from the regulator,
   wherein the voltage detection circuit outputs the voltage detection signal to the power-on-reset circuit when the output voltage is equal to or higher than a detection voltage, and
   the power-on-reset circuit outputs the reset signal to the external digital circuit when the power-on-reset circuit receives the voltage detection signal from the voltage detection circuit.

2. A position detector comprising:
   a solar cell;
   a memory to which a power supply voltage is supplied from the solar cell;
   a position detection IC configured to be reset by a reset signal from the memory;
   a sensor configured to be activated by the position detection IC and to output a position signal; and
   a display unit configured to display a detection result of the position detection IC,
   wherein the memory comprises:

a regulator configured to stabilize the power supply voltage from the solar cell and to output the same, a voltage detection circuit configured to detect the power supply voltage from the solar cell or an output voltage from the regulator, a power-on-reset circuit configured to output a reset signal to the position detection IC by a voltage detection signal output from the voltage detection circuit, and a memory main body configured to write and read data by the power supply voltage from the solar cell or the output voltage from the regulator, and wherein the voltage detection circuit outputs the voltage detection signal to the power-on-reset circuit when the output voltage is equal to or higher than a detection voltage, and the power-on-reset circuit outputs the reset signal to the external digital circuit when the power-on-reset circuit receives the voltage detection signal from the voltage detection circuit.

* * * * *